United States Patent
Min

(10) Patent No.: US 8,546,944 B2
(45) Date of Patent: Oct. 1, 2013

(54) MULTILAYER DIELECTRIC MEMORY DEVICE

(75) Inventor: Kyu S. Min, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 208 days.

(21) Appl. No.: 12/976,266

(22) Filed: Dec. 22, 2010

(65) Prior Publication Data

US 2012/0161318 A1   Jun. 28, 2012

(51) Int. Cl.
*H01L 23/48* (2006.01)
*H01L 21/4763* (2006.01)

(52) U.S. Cl.
USPC ........... 257/751; 257/758; 257/762; 257/765; 438/627; 438/643; 438/687

(58) Field of Classification Search
USPC .............. 257/751, 758, 762, 765, E23.141; 438/261, 627, 643, 652, 687, 688
See application file for complete search history.

(56) References Cited

U.S. PATENT DOCUMENTS

| 5,618,746 A | 4/1997 | Hwang |
| 2001/0015451 A1 | 8/2001 | Nagano et al. |
| 2006/0043595 A1* | 3/2006 | Aratani et al. ............. 257/758 |
| 2010/0155953 A1 | 6/2010 | Bornstein |
| 2010/0193760 A1 | 8/2010 | Takagi et al. |

OTHER PUBLICATIONS

International Searching Authority, "Notification of Transmittal of the International Search Report and the Written Opinion of the International Searching Authority," mailed Jul. 16, 2012, in International application No. PCT/US2011/064262.

* cited by examiner

*Primary Examiner* — Hsien Ming Lee
(74) *Attorney, Agent, or Firm* — Trop, Pruner & Hu, P.C.

(57) ABSTRACT

A memory device has multiple dielectric barrier regions. A memory device has multiple barrier regions that provide higher or lower current-voltage slope compared to a memory device having a single barrier region. The device also has electrode regions that provide further control over the current-voltage relationship.

36 Claims, 12 Drawing Sheets

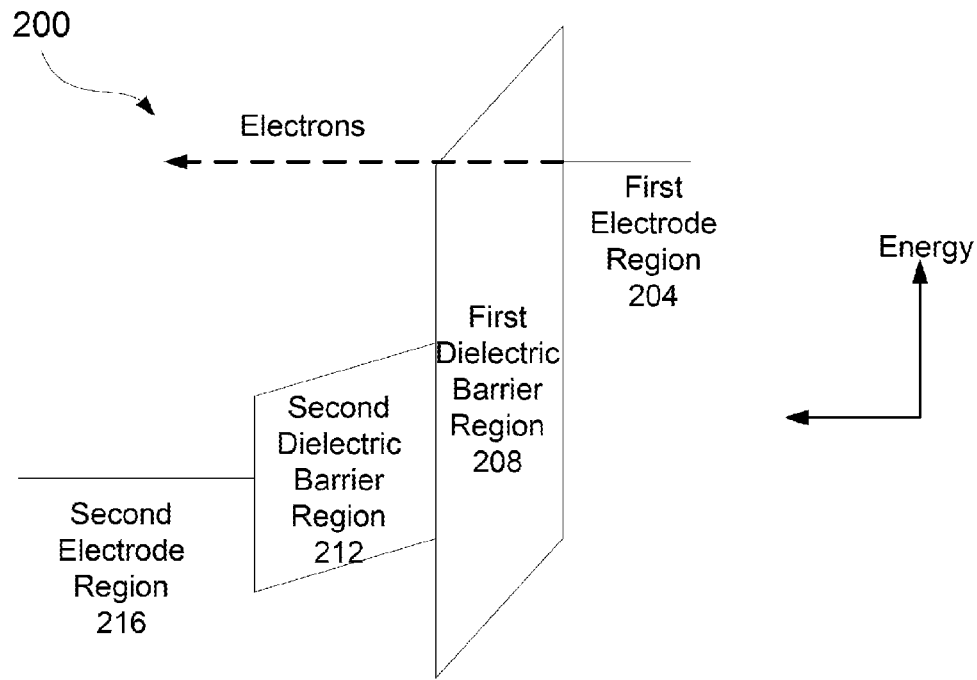
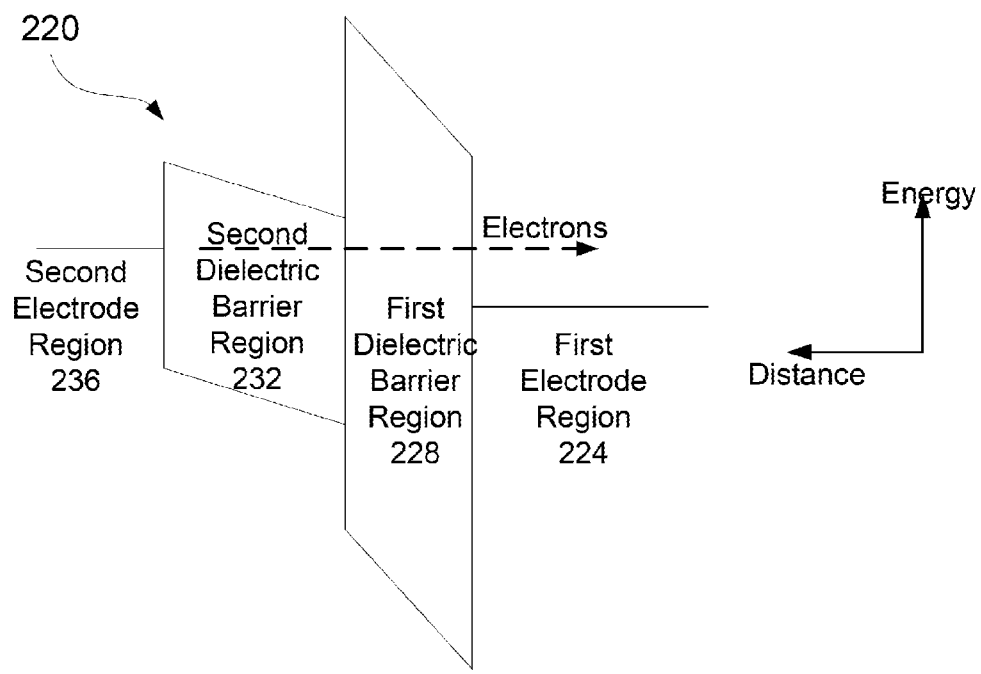

MULTILAYER DIELECTRIC MEMORY DEVICE

BACKGROUND

Physical scaling of transistor-based nonvolatile memory devices such as a flash memory device faces many challenges. Alternative to transistor-based memory devices and memory arrays are being considered.

BRIEF DESCRIPTION OF THE DRAWINGS

FIG. 4a depicts a schematic energy-distance diagram of a memory stack comprising two dielectric barrier regions under a condition where a negative voltage bias is applied to the first electrode region.

FIG. 4b depicts a schematic energy-distance diagram of a memory stack comprising two dielectric barrier regions under a condition where a positive voltage bias is applied to the first electrode region.

DETAILED DESCRIPTION OF EXAMPLE EMBODIMENT

Figure 1:
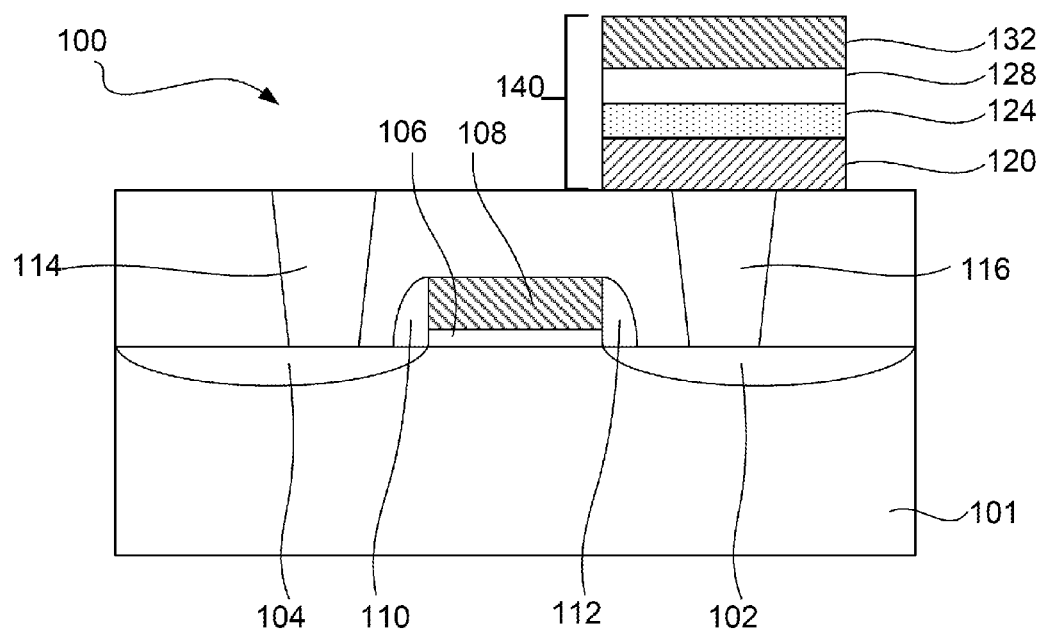
FIG. 1 is a cross-sectional view of a memory stack integrated with an access transistor.

In various embodiments, a memory device comprising dielectric barrier regions and its fabrication methods are described. In the following description, various embodiments will be described. However, a person of ordinary skill in the art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment that falls within the scope of the invention, but do not denote that they are necessarily present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order, in series or in parallel, than the described embodiment. Various additional operations may be performed and/or described operations may be omitted in additional embodiments.

It is to be understood that when an element is referred to as being "on," "connected to," or "coupled to" another element or layer, it may be directly on, connected, or coupled to the other element, or alternatively, intervening elements may be present between the element and the other element. When an element referred to as being "directly on," "in contact with," "directly connected to," or "directly coupled with," it may be directly on, in contact with, directly connected to, or directly coupled to, without intervening elements.

It is to be understood that spatially descriptive terms, e.g., "above," "below," "beneath," "upper," "lower" and the like, may be used herein to describe the relative spatial relationship of one element, component, or region to another element, component, or region, and that the spatially descriptive terms encompass different orientations of one element, component, or region in an embodiment. For example, if an embodiment describes an element as "below" another element, the same element would be "above" the other element when the embodiment is turned upside down.

FIG. 1 is a cross-sectional view illustrating an example embodiment of a memory stack 140 that is integrated with an access transistor 100. The memory stack 140 and the access transistor 100 may be formed on a substrate 101 comprising a Si wafer. In other embodiments, the substrate 101 may be any substrate comprising a semiconducting material such as GaAs, InAs, InGaAs, Ge, or silicon-on-insulator. In other embodiments, the substrate 101 may have partially or completely fabricated structures, components, or circuits. For example, the substrate 101 may include integrated circuits with various components such as transistors, diodes, or interconnects, which may or may not be electrically coupled to the memory stack 140 or the access transistor 100.

The access transistor 100 comprises a gate dielectric 106, a gate 108 on the gate dielectric 106, a source 104, a drain 102, and spacers 110 and 112. The access transistor 100 also includes a source contact 114 and a drain contact 116. In an embodiment, the memory stack 140 may be coupled to the drain 102 of the transistor 100 through the drain contact 116.

In another embodiment, the memory stack 140 may be coupled to the source 104 of the access transistor 100 through the source contact 114. In other embodiments, different arrangements of coupling the memory 140 to the access transistor 100 may be possible.

The memory stack comprises a first electrode region 120, a first dielectric barrier region 124, a second dielectric barrier region 128, and a second electrode region 132.

A memory cell may be accessed for various operations including read, write, inhibit, and erase through the access transistor 100. In an exemplary operation, a gate voltage may be placed on the gate 108, and a memory access voltage may be placed on the second electrode region 140. In another exemplary operation, a gate voltage may be placed on the gate 108, and a memory access voltage may be placed on the source 104 through the source contact 114.

A read operation may be an operation that detects a read voltage, a read current, or both, through the second electrode region 132 while a read gate voltage is applied to the gate 108. In an embodiment, a read current may be detected while a positive read voltage is applied on the second electrode region 132 contemporaneously with a read gate voltage applied on the gate 108. In another embodiment, a read current may be detected while a negative read voltage is applied on the second electrode region 132 contemporaneously with a read gate voltage applied on the gate 108. In an embodiment, a read operation may be non-destructive and induces an insignificant change to the memory stack 140 such that when a first, a second, and a third read operations are performed in immediate succession, the third read operation yields substantially the same read voltage, read current, or both compared to the first read operation. In another embodiment, a read operation may be destructive and induces a significant change to the memory stack 140 such that when a first, a second, and a third read operations are performed in immediate succession, the third read operation yields substantially the same read voltage, read current, or both compared to the first read operation.

A write operation may be an operation that induces substantial change to the memory stack 140 such that a subsequent read operation performed after performing a write operation yields substantially the read voltage, read current, or both compared to a read operation performed prior to the write operation. In an embodiment, the write operation may be performed with a write voltage on the second electrode region 132 that is of the same voltage polarity as the read voltage polarity. In another embodiment, the write operation may be performed with a write voltage on the second electrode region 132 that is of the opposite voltage polarity as the read voltage polarity. In an embodiment, the result of a write operation may be a higher subsequent read current, read voltage, or both. In another embodiment, the result of a write operation may be a lower subsequent read current, read voltage, or both.

An erase operation may be an operation that induces a substantially opposite change in the read current, read voltage, or both, compared to the write operation. In an embodiment, the erase operation may be performed with an erase voltage on the second electrode region 132 which is of the same voltage polarity as the read voltage polarity. In another embodiment, the erase operation may be performed with an erase voltage on the second electrode region 132 which is of the opposite voltage polarity as the read voltage polarity. In an embodiment, the result of an erase operation may be a higher subsequent read current, read voltage, or both. In another embodiment, the result of an erase operation may be a lower subsequent read current, read voltage, or both.

Figure 2A:
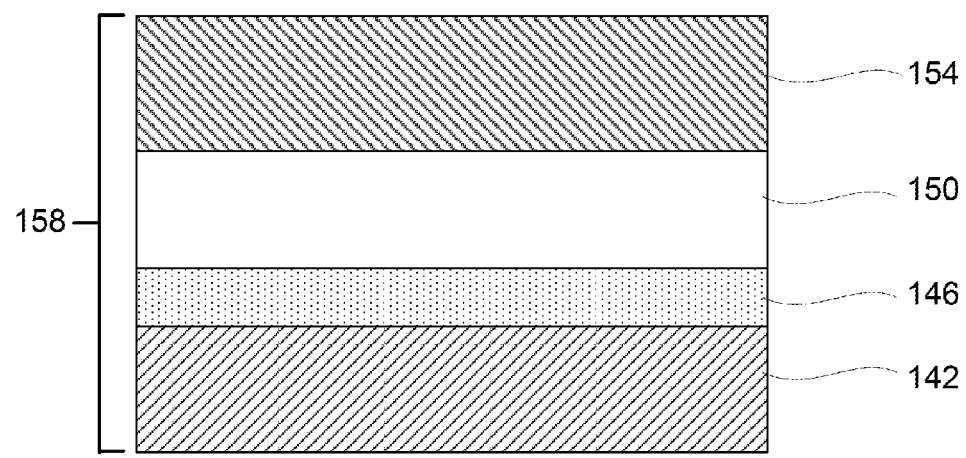
FIG. 2a is a cross-sectional view an isolated memory stack comprising two dielectric barrier regions.

FIG. 2a shows an example embodiment of an isolated memory stack 158. The isolated memory stack 158 comprises a first electrode region 142, a first dielectric barrier region 146, a second dielectric barrier region 150, and a second electrode region 154. In other embodiments, the first dielectric barrier region 146 may be referred to as a first memory barrier region. Similarly, the second dielectric barrier region 150 may be referred to as a second memory barrier region.

Referring to FIG. 2a, the first electrode region 142 may comprise a metallic element. In an embodiment, the first electrode region 142 may comprise an element chosen from the group consisting Ti, Ta, Pt, Ru, Ni, W, Al, and Cu. In another embodiment, the first electrode region 142 may comprise a metal oxide or a metal nitride, such as TiN, TaN, WO, SrRuO, etc. It is to be understood that metal oxides and metal nitrides may have a rage of composition. In another embodiment, the first electrode region 142 may comprise a doped semiconductor, such as heavily doped Si or Ge.

In any given embodiment, the material choice for the first electrode region 142 may be made based upon the work function or the effective work function of the material. An ordinary person skilled in the art will appreciate that for a metallic material, a more practical parameter may be the effective work function, which may be an apparent work function specific to the system being measured, instead of the work function measured in relation to vacuum energy level. In an embodiment, the first electrode region 142 may comprise a metal whose work function or the effective work function ranges from 2.7 eV (electron-volts) to 3.5 eV. In another embodiment, the first electrode region 142 may comprise a metal whose work function or the effective work function ranges from 3.5 eV to 4.3 eV. In yet another embodiment, the first electrode region 142 may comprise a metal whose work function or the effective work function ranges from 2.7 eV to 4.3 eV.

FIG. 2a shows a first dielectric barrier region 146 on the first electrode region 142. The first dielectric barrier region 146 has a first thickness. In an embodiment, the first thickness can be 0.5-2 nm. In another embodiment, the first thickness can be 2-5 nm. In another embodiment, the first thickness can be 5-10 nm. In yet another embodiment, the first thickness can be 0.5-10 nm.

It is to be understood that the first dielectric barrier region 146 may be substantially smooth and/or substantially planar in some embodiments. In other embodiments, the first dielectric barrier region 146 may not be substantially smooth and/or substantially planar. Accordingly, the first thickness of the first dielectric barrier region 146 may not be a single value. In an embodiment, the first thickness may be an average thickness of multiple measurements across the first dielectric barrier region 146. In another embodiment, the first thickness may be a minimum thickness of multiple measurements across the first dielectric barrier region 146. In another embodiment, the first thickness may be a maximum thickness of multiple measurements across the first dielectric barrier region 146. In yet another embodiment, the first thickness may be a thickness measured across at least one location across the first dielectric barrier region 146.

The first dielectric barrier region 146 has a first dielectric constant. In an embodiment, the first dielectric constant can be 3-7. In another embodiment, the first dielectric constant can be 7-10. In yet another embodiment, the first dielectric constant can be 3-10.

The first dielectric barrier region 146 is further characterized by a first barrier height between the first dielectric barrier region 146 and the first electrode region 142. In an embodiment, the first barrier height is between 0.5 eV and 2.0 eV. In another embodiment, the first barrier height is between 2.0 eV and 3.0 eV. In another embodiment, the first barrier height is between 3.0 eV and 4 eV. In yet another embodiment, the first barrier height is between 0.5 eV and 4 eV.

The first dielectric barrier region 146 comprises a first barrier material. In an embodiment, the first dielectric barrier region 146 may comprise a dielectric based on a single metal oxide, a single metal nitride, or a single metal oxynitride of Si, Al, Mg, La, Gd, Dy, Pd or Sc. For example, a single metal oxide may be $SiO_2$ or $Al_2O_3$. In another embodiment, the first dielectric barrier region 146 may comprise a dielectric based on a multiple metal oxide, a multiple metal nitride, or a multiple metal oxynitride containing metals chosen from a group consisting of Si, Al, Hf, Zr, Mg, La, Y, Gd, Dy, Pd and Sc. For example, a multiple metal oxide may be $HfSiO_4$ or $LaAlO_3$.

It is to be understood that the word "stoichiometric" describes a stable material composition under ordinary conditions. For example, a person having ordinary skill in the art will understand that a stoichiometric oxide of silicon will be $SiO_2$, whose metal to oxygen ratio is substantially close to 2. Similarly, the word "sub-stoichiometric" describes a material composition which substantially departs from the stoichiometric composition. For example, it will be understood that a sub-stoichiometric oxide of silicon will be $SiO_x$, where x is substantially less than its stoichiometric value of 2. Similarly, a sub-stoichiometric multiple metal oxide of silicon and hafnium will be $HfSiO_x$, where x is substantially less than its stoichiometric value of 4.

Figure 2B:
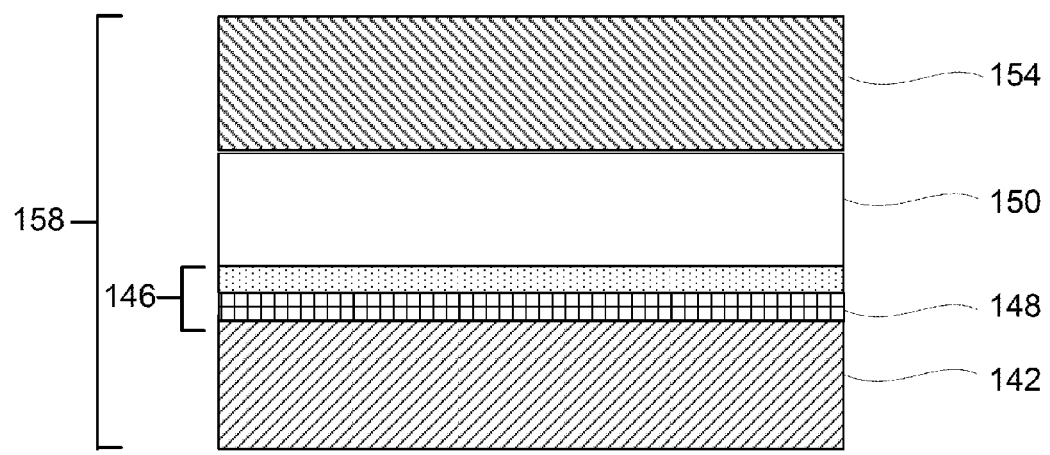
FIG. 2b is a cross-sectional view an isolated memory stack comprising two dielectric barrier regions with a region, where the first dielectric barrier region has a sub-region.

FIG. 2b shows an example embodiment wherein the first dielectric barrier region 146 comprises a first dielectric sub-region 148 comprising a dielectric whose composition departs from its stoichiometric composition by 10 to 30%. In another embodiment, the first dielectric barrier region 146 may comprise a first dielectric sub-region 148 comprising a dielectric whose composition departs from its stoichiometric composition by 30% to 50%. In another embodiment, the first dielectric barrier region 146 may comprise a first dielectric sub-region 148 comprising a dielectric whose composition departs from its stoichiometric composition by 50% to 70%. In yet another embodiment, the first dielectric barrier region 146 may comprise a first dielectric sub-region 148 comprising a dielectric whose composition departs from its stoichiometric composition by 10% to 70%. It is to be understood that while in the embodiment in FIG. 2b, the first dielectric sub-region 148 is located in the lower portion of the first dielectric barrier region 146, other embodiments may have the first dielectric sub-region 148 located anywhere within the first dielectric barrier region 146.

In an embodiment, the composition of the first dielectric barrier region 146 may be graded such that its composition varies continuously across its thickness by 10 to 30%. In another embodiment, the composition of the first dielectric barrier region 146 may be graded such that its composition varies continuously across its thickness by 30 to 50%. In an embodiment, the composition of the first dielectric barrier region 146 may be graded such that its composition varies continuously across its thickness by 50 to 70%. In yet another embodiment, the composition of the first dielectric barrier region 146 may be graded such that its composition varies continuously across its thickness by 10 to 70%.

In an embodiment, the first dielectric barrier region 146 may be in direct contact with the first electrode region 142. In another embodiment, the first dielectric barrier region 146 may be separated by one or more interfacial layers comprising at least one element different from elements that comprise either the first electrode region 142 or the first dielectric barrier region 146.

FIG. 2a also shows a second dielectric barrier region 150 on the first electrode region 142. The second dielectric barrier region 150 has a second thickness different than the first thickness of the first dielectric barrier region 146. In an embodiment the second thickness can be 2-5 nm. In another embodiment, the second thickness can be 5-10 nm. In yet another embodiment, the second thickness can be 10-20 nm. In an embodiment, the second thickness of the second dielectric barrier region 150 is greater than the first thickness of the first dielectric barrier region 146.

It is to be understood that the second dielectric barrier region 150 may be substantially smooth and/or substantially planar in some embodiments. In other embodiments, the second dielectric barrier region 150 may not be substantially smooth and/or substantially planar. Accordingly, the second thickness of the second dielectric barrier region 150 may not be a single value. In an embodiment, the second thickness may be an average thickness of multiple measurements across the second dielectric barrier region 150. In another embodiment, the second thickness may be a minimum thickness of multiple measurements across the first dielectric barrier region 150. In another embodiment, the second thickness may be a maximum thickness of multiple measurements across the second dielectric barrier region 150. In yet another embodiment, the second thickness may be a thickness measured across at least one location across the second dielectric barrier region 150.

The second dielectric barrier region 150 has a second dielectric constant different from the second dielectric constant of the first dielectric barrier region 146. In an embodiment, the second dielectric constant can be 7 to 20. In another embodiment, the second dielectric constant can be 20-100. In another embodiment, the second dielectric constant can be 100 to 3000. In yet another embodiment, the second dielectric constant can be 100 to 3000.

In an embodiment, the second dielectric constant of the second barrier region 150 is 2 to 5 times higher than the first dielectric constant of the first dielectric barrier region 146. In another embodiment, the second dielectric constant of the second barrier region 150 is 5 to 20 times higher than the first dielectric constant of the first dielectric barrier region 146. In another embodiment, the second dielectric constant of the second barrier region 150 is 20 to 1000 times higher than the first dielectric constant of the first dielectric barrier region 146. In yet another embodiment, the second dielectric constant of the second barrier region 150 is 2 to 1000 times higher than the first dielectric constant of the first dielectric barrier region 146.

The second dielectric barrier region 150 is further characterized by a second barrier height between the second dielectric barrier region 150 and the first electrode region 142. In an embodiment, the second barrier height is between 0 eV and 0.5 eV. In another embodiment, the second barrier height is between 0.5 eV and 1.5 eV. In another embodiment, the second barrier height is 1.5 eV to 3 eV. In yet another embodiment, the second barrier height is 0 eV to 3 eV.

In an embodiment, the second barrier height between the second barrier region 150 and the first electrode region 142 is lower than the first barrier height between the first barrier region 146 and the first electrode region 142 by 0 eV to 1 eV. In another embodiment, the second barrier height between the second barrier region 150 and the first electrode region 142 is lower than the first barrier height between the first barrier region 146 and the first electrode region 142 by 1 eV to 2 eV.

In another embodiment, the second barrier height between the second barrier region 150 and the first electrode region 142 is lower than the first barrier height between the first barrier region 146 and the first electrode region 142 by 2 eV to 3 eV. In yet another embodiment, the second barrier height between the second barrier region 150 and the first electrode region 142 is lower than the first barrier height between the first barrier region 146 and the first electrode region 142 by 0 eV to 3 eV.

The second dielectric barrier region 150 comprises a second barrier material. In an embodiment, the second dielectric barrier region 150 may comprise a dielectric based on a single metal oxide, a single metal nitride, or a single metal oxynitride of W, Ni, Mo, Cu, Ti, Ta, Hf or Zr. In another embodiment, the second dielectric barrier region 150 may comprise a dielectric based on a multiple metal oxide, a multiple metal nitride, or a multiple metal oxynitride containing metals chosen from a group consisting of W, Ni, Mo, Cu, Ti, Ta, Hf, Sr, Ba, Pr, Ca, and Mn. For example, a multiple metal oxides may be $SrTiO_x$, $BaTiO_x$, or $PrCaMnO_x$, where x can be any value up to a value required to achieve full stoichiometry. In an embodiment, the second dielectric barrier region 150 may be a material comprising at least one element different from elements that comprise the first dielectric barrier region 146.

Figure 2C:
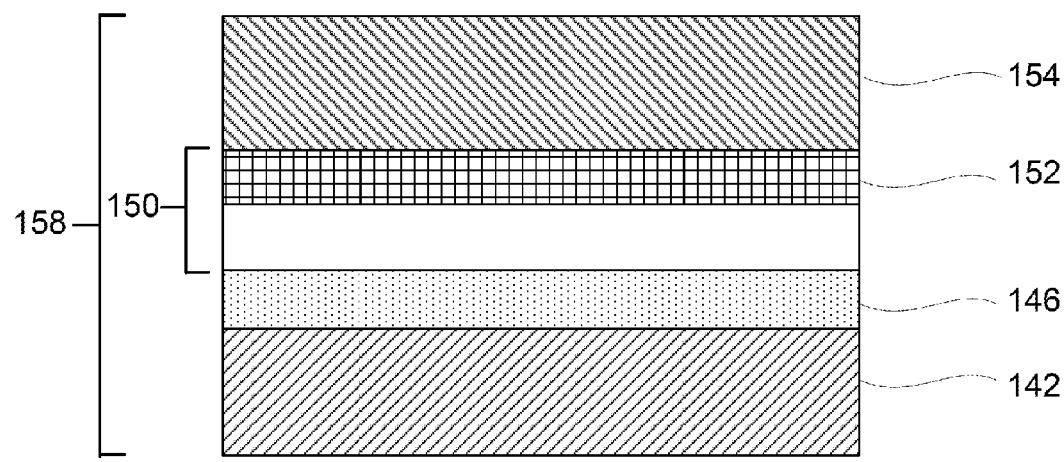
FIG. 2c is a cross-sectional view an isolated memory stack comprising two dielectric barrier regions with a region, where the second dielectric barrier region has a sub-region.

FIG. 2c shows an example embodiment wherein the second dielectric barrier region 150 comprises a second dielectric sub-region 152 comprising a dielectric whose composition departs from its stoichiometric composition by 10 to 30%. In another embodiment, the second dielectric barrier region 150 may comprise a second dielectric sub-region 152 comprising a dielectric whose composition departs from its stoichiometric composition by 10 to 30%. In another embodiment, the second dielectric barrier region 150 may comprise a second dielectric sub-region 152 comprising a dielectric whose composition departs from its stoichiometric composition by 30% to 50%. In another embodiment, the second dielectric barrier region 150 may comprise a second dielectric sub-region 152 comprising a dielectric whose composition departs from its stoichiometric composition by 50% to 70%. In yet another embodiment, the second dielectric barrier region 150 may comprise a second dielectric sub-region 152 comprising a dielectric whose composition departs from its stoichiometric composition by 10% to 70%. It is to be understood that while in the embodiment in FIG. 2c, the second dielectric sub-region 152 is located in the upper portion of the second dielectric barrier region 150, other embodiments may have the second dielectric sub-region 152 located anywhere within the second dielectric barrier region 150.

In an embodiment, the composition of the second dielectric barrier region 150 may be graded such that its composition varies continuously across its thickness by 10 to 30%. In another embodiment, the composition of the second dielectric barrier region 150 may be graded such that its composition varies continuously across its thickness by 30 to 50%. In an embodiment, the composition of the second dielectric barrier region 150 may be graded such that its composition varies continuously across its thickness by 50 to 70%. In yet another embodiment, the composition of the second dielectric barrier region 150 may be graded such that its composition varies continuously across its thickness by 10 to 70%.

In an embodiment, the second dielectric barrier region 150 may be in direct contact with the first dielectric barrier region 146. In another embodiment, the second dielectric barrier region 150 may be separated from the first dielectric barrier region 142 by one or more interfacial layers comprising at least one element different from elements that comprise either the first electrode region 142 or the second dielectric barrier region 150.

Referring to FIG. 2a, the second electrode region 154 may comprise a metallic element. In an embodiment, the second electrode region 154 may comprise an element chosen from the group consisting Ti, Ta, Pt, Ru, Ni, W, Al, and Cu. In another embodiment, the second electrode region 154 may comprise a metal oxide or a metal nitride, such as TiN, TaN, WO, SrRuO, etc. It is to be understood that metal oxides and metal nitrides may have a rage of composition. In another embodiment, the second electrode region 154 may comprise a doped semiconductor, such as heavily doped Si or Ge. In an embodiment, the second electrode region 154 contains at least one element which the first electrode region 142 does not contain. In another embodiment, the second electrode region 154 comprises the same elements as the first electrode region 142.

In any given embodiment, the material choice for the second electrode region 154 may be made based upon the work function or the effective work function of the material. An ordinary person skilled in the art will appreciate that for a metallic material, a more practical parameter may be the effective work function, which may be an apparent work function specific to the system being measured, instead of the work function measured in relation to vacuum energy level. In an embodiment, the second electrode region 154 may comprise a metal whose work function or the effective work function ranges from 2.7 eV to 3.5 eV. In another embodiment, the second electrode region 154 may comprise a metal whose work function or the effective work function ranges from 3.5 eV to 4.3 eV. In yet another embodiment, the second electrode region 154 may comprise a metal whose work function or the effective work function ranges from 2.7 eV to 4.3 eV.

In an embodiment, the second electrode region 154 may be in direct contact with the second dielectric barrier region 150. In another embodiment, the second electrode region 154 may be separated by one or more interfacial layers comprising a material comprising at least one element different from elements that comprise either the second electrode region 154 or the second dielectric barrier region 150.

Figure 3:
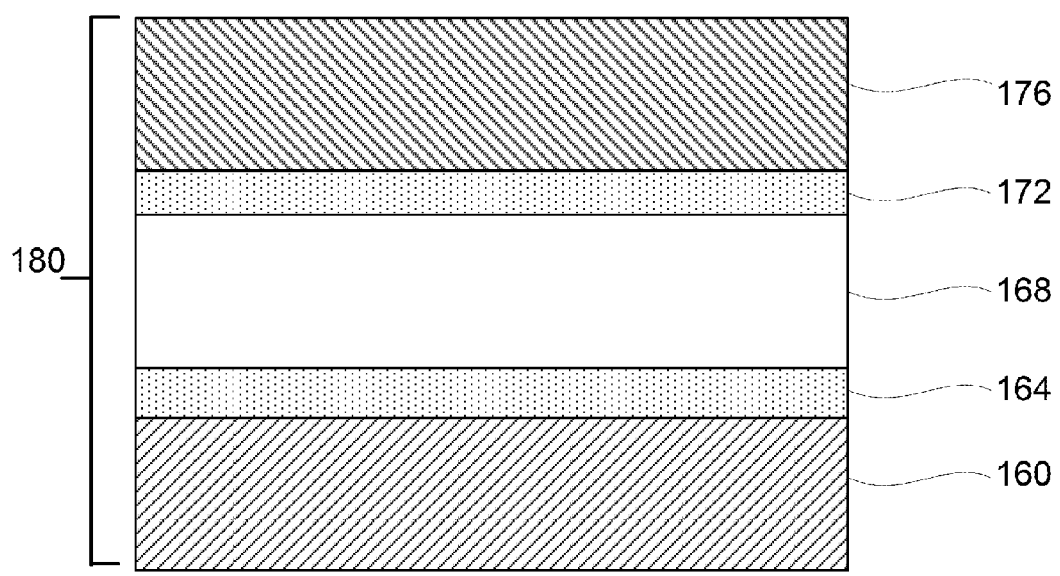
FIG. 3 is a cross-sectional view an isolated memory stack comprising three dielectric barrier regions.

FIG. 3 shows an example embodiment of an isolated memory stack 180. A first electrode region 160, a first dielectric barrier region 164, a second dielectric barrier region 168, and second electrode region 176 may be characterized by substantially the same compositions, structures, and properties as the first electrode region 142, the first dielectric barrier region 146, the second dielectric barrier region 150, and the second electrode region 154, respectively, as described in reference to FIG. 2a for the isolated memory stack 158.

Referring to FIG. 3, the isolated memory stack 180 further comprises a third dielectric barrier region 172 between the second dielectric barrier region 168 and the second electrode region 176. In other embodiments, the third dielectric barrier region 172 may be referred to as a third memory barrier region.

The third dielectric barrier region 172 has a third thickness and a third dielectric constant. In an embodiment the third thickness can be 0.5-2 nm. In another embodiment, the third thickness can be 2-5 nm. In another embodiment, the third thickness can be 5-10 nm. In yet another embodiment, the third thickness can be 0.5-10 nm.

It is to be understood that the third dielectric barrier region 172 may be substantially smooth and/or substantially planar in some embodiments. In other embodiments, the third dielectric barrier region 172 may not be substantially smooth and/or substantially planar. Accordingly, the third thickness of the third dielectric barrier region 172 may not be a single value. In an embodiment, the third thickness may be an average thickness of multiple measurements across the third dielectric barrier region 172. In another embodiment, the third thickness may be a minimum thickness of multiple measurements across the third dielectric barrier region 172. In another embodiment, the third thickness may be a maximum thickness of multiple measurements across the third dielectric barrier region 172. In yet another embodiment, the third thickness may be a thickness measured across at least one location across the third dielectric barrier region 172.

In an embodiment the third dielectric constant can be 3-7. In another embodiment, the third dielectric constant can be 7-10. In an embodiment, the third thickness and/or the third dielectric constant of the third dielectric barrier region 172 may be substantially the same as the first thickness and/or the first dielectric constant of the first dielectric barrier region 164. In other embodiments, the third thickness and/or the third dielectric constant may be substantially different from the first thickness and/or the first dielectric constant.

The third dielectric barrier region 172 is further characterized by a third barrier height between the third dielectric barrier region 172 and the first electrode region 160. A barrier height carries the ordinary meaning of the energy difference between the conduction band edge of a dielectric material and the work function or the effective work function of a metallic material. In an embodiment, the third barrier height is between 0.5 eV and 2.0 eV. In another embodiment, the third barrier height is between 2.0 eV and 3.0 eV. In another embodiment, the third barrier height is between 3.0 eV and 4 eV. In yet another embodiment, the third barrier height is between 0.5 eV and 4 eV.

In an embodiment, the third barrier height between the third dielectric barrier region 172 and the first electrode region 160 may be substantially the same as the first barrier height between the first dielectric barrier region 164 and the first electrode region 160. In other embodiments, the third barrier height may be substantially different from the first barrier height.

The third dielectric barrier region 172 comprises a third barrier material. In an embodiment, the third dielectric barrier region 172 may comprise a dielectric based on a single metal oxide, a single metal nitride, or a single metal oxynitride of Si, Al, Mg, La, Gd, Dy, Pd or Sc. For example, a single metal oxide may be $SiO_2$ or $Al_2O_3$. In another embodiment, the third dielectric barrier region 172 may comprise a dielectric based on a multiple metal oxide, a multiple metal nitride, or a multiple metal oxynitride containing metals chosen from a group consisting of Si, Al, Hf, Zr, Mg, La, Y, Gd, Dy, Pd and Sc. For example, a multiple metal oxide may be $HfSiO_4$ or $LaAlO_3$.

In an embodiment, the third dielectric barrier region 172 may comprise substantially the same dielectric material as that which comprises the first dielectric barrier region 164. In other embodiments, the third dielectric barrier region 172 may comprise substantially different dielectric material as that which comprises the first dielectric barrier region 164. In yet other embodiments, the third dielectric barrier region 172 may consist of substantially the same dielectric material as that which the first dielectric barrier region 164 consists of.

In an embodiment, the third dielectric barrier region 172 may comprise a third dielectric sub-region (not shown) comprising a dielectric whose composition departs from its stoichiometric composition by 10 to 30%. In another embodiment, the third dielectric barrier region 172 may comprise a third dielectric sub-region (not shown) comprising a dielectric whose composition departs from its stoichiometric composition by 30% to 50%. In another embodiment, the third dielectric barrier region 150 may comprise a third dielectric sub-region (not shown) comprising a dielectric whose composition departs from its stoichiometric composition by 50% to 70%. In yet another embodiment, the third dielectric barrier region 150 may comprise a third dielectric sub-region (not shown) comprising a dielectric whose composition departs from its stoichiometric composition by 10% to 70%.

In an embodiment, the composition of the third dielectric barrier region 172 may be graded such that its composition varies continuously across its thickness by 10 to 30%. In another embodiment, the composition of the third dielectric barrier region 172 may be graded such that its composition varies continuously across its thickness by 30 to 50%. In an embodiment, the composition of the third dielectric barrier region 172 may be graded such that its composition varies continuously across its thickness by 50 to 70%. In yet another embodiment, the composition of the third dielectric barrier region 172 may be graded such that its composition varies continuously across its thickness by 10 to 70%.

In an embodiment, the third dielectric barrier region 172 may be in direct contact with the second dielectric barrier region 168. In another embodiment, the third dielectric barrier region 172 may be separated by one or more interfacial layers comprising at least one element different from elements that comprise either the third dielectric barrier region 172 or the second dielectric barrier region 168.

FIG. 4a depicts a schematic energy-distance diagram of a memory stack 200 comprising a first dielectric barrier region 208 and a second dielectric barrier region 212 under a condition where a negative voltage bias is applied to the first electrode region 204. Under certain voltage conditions, the memory stack 200 may result in a condition where the electric current is produced by electrons predominantly tunneling through the first dielectric barrier region 208. Under other voltage conditions, the memory stack 200 may result in a condition where the electric current is produced by electrons tunneling through the first dielectric barrier region 208 and through the second dielectric barrier region 212.

FIG. 4b depicts a schematic energy-distance diagram of a memory stack 220 comprising a first dielectric barrier region 228 and a second dielectric barrier region 232 under a condition where a negative voltage bias is applied to the second electrode region 236. Under certain voltage conditions, the memory stack 220 may result in a condition where the electric current is produced by electrons tunneling through the second dielectric barrier region 232 and through the first dielectric barrier region 228.

Referring to FIG. 4a and FIG. 4b, in an embodiment, the magnitude of the current produced through the memory stack 200 under a negative voltage bias applied to the first electrode region 204 will be substantially greater than the magnitude of the current produced through the memory stack 220 comprising identical components as the memory stack 200 under a negative voltage bias applied to the second electrode region 236.

Figure 5A:
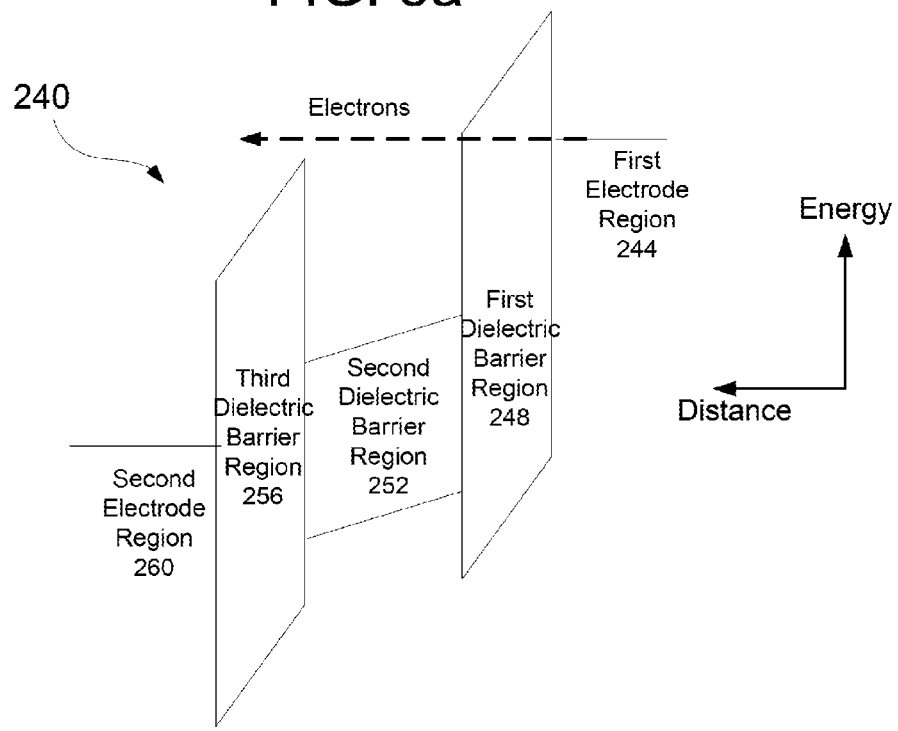
FIG. 5a depicts a schematic energy-distance diagram of a memory stack comprising three dielectric barrier regions under a condition where a negative voltage bias is applied to the first electrode region.

FIG. 5a depicts a schematic energy-distance diagram of a memory stack 240 comprising a first dielectric barrier region 248, a second dielectric barrier region 252, and a third dielectric barrier region 256 under a condition where a negative voltage bias is applied to the first electrode region 244. Under certain voltage conditions, the memory stack 240 may result in a condition where the electric current is produced by electrons predominantly tunneling through the first dielectric barrier region 248. Under other voltage conditions, the memory stack 240 may result in a condition where the electric current is produced by electrons tunneling through the first dielectric barrier region 248, the second dielectric barrier region 252, and through the third dielectric barrier region 256. Under yet other voltage conditions, the memory stack 240 may result in a condition where the electric current is produced by electrons tunneling through the first dielectric barrier region 248 and through the third dielectric barrier region 256.

Figure 5B:
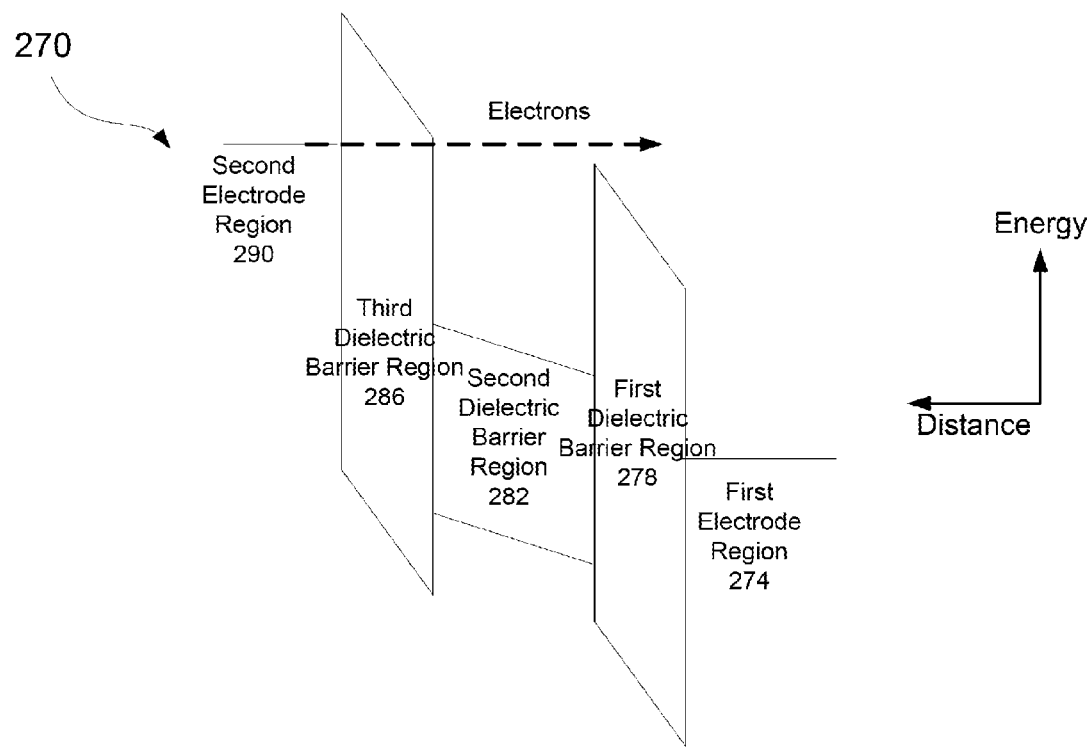
FIG. 5b depicts a schematic energy-distance diagram of a memory stack comprising three dielectric barrier regions under a condition where a positive voltage bias is applied to the first electrode region.

FIG. 5b depicts a schematic energy-distance diagram of a memory stack 270 comprising a first dielectric barrier region 278, a second dielectric barrier region 282, and a third dielectric barrier region 286 under a condition where a negative voltage bias is applied to the second electrode region 290. Under certain voltage conditions, the memory stack 270 may result in a condition where the electric current is produced by electrons predominantly tunneling through the third dielectric barrier region 286. Under other voltage conditions, the memory stack 270 may result in a condition where the electric current is produced by electrons tunneling through the third dielectric barrier region 286, the second dielectric barrier region 282, and through the first dielectric barrier region 278. Under yet other voltage conditions, the memory stack 270 may result in a condition where the electric current is produced by electrons tunneling through the third dielectric barrier region 286 and through the first dielectric barrier region 278.

Referring to FIG. 5a and FIG. 5b, in an embodiment, the magnitude of the current produced through the memory stack 240 under a negative voltage bias applied to the first electrode region 244 will be substantially similar to the magnitude of the current produced through the memory stack 270 comprising identical components as the memory stack 240 under a negative voltage bias applied to the second electrode region 290.

FIGS. 6 through 9 are cross-sectional views illustrating the steps of fabricating a semiconductor device including a memory stack similar to the memory stack 158 or the memory stack 180 according to some embodiments.

Figure 6:
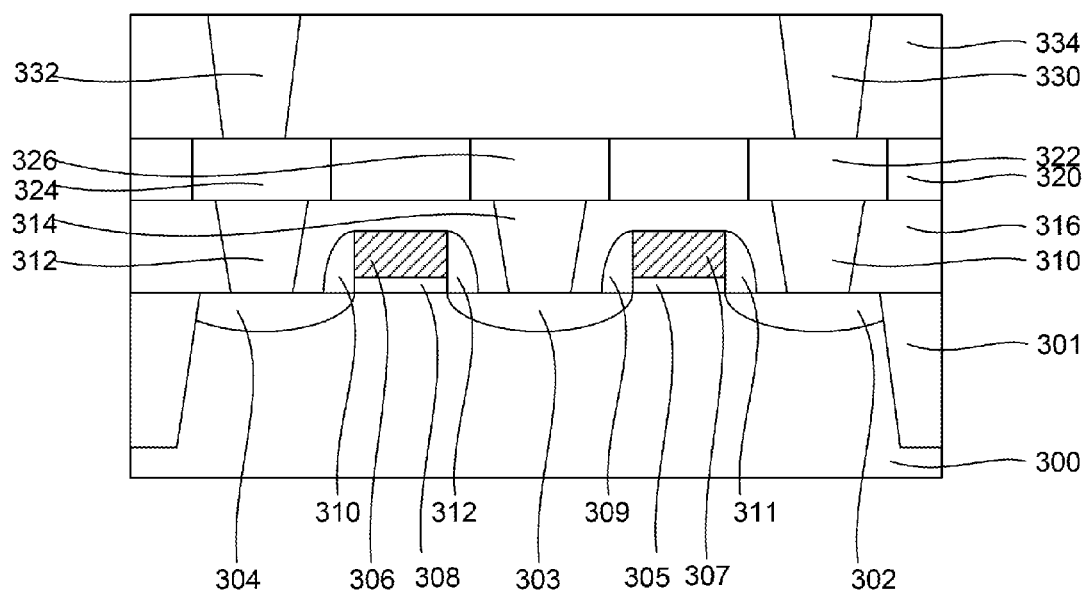
FIGS. 6 through 9 are cross-sectional views illustrating the steps of memory stacks integrated with access transistors.

Referring to FIG. 6, a plurality of transistors comprising gate dielectrics 305 and 308, transistor gates 306 and 307, spacers 310, 312, 309, and 311, drain regions 302 and 304, and a source region 303 may be formed on a substrate 300, as described herein. It will be understood that while some types of transistors that may be used are described with some specificity herein, in various other embodiments, widely varying types of transistors such as planar transistors, vertical transistors, multigate transistors, transistors based on nanotubes, transistors based on nanowires, transistors based on spin transfer, transistors based on buried channel, transistors based on quantum wells, and various other transistors based on different materials and structures may be used.

An isolation 301 may be formed on the substrate 300 to define an active area. The isolation 301 may be formed by a shallow trench isolation (STI) process using an oxide formed by methods such as high-density plasma chemical vapor deposition (HDPCVD), chemical vapor deposition (CVD), spin-on glass process (SOG), or comparable methods. Other types of isolation may also be used in other embodiments.

Gate dielectrics 305 and 308 comprising a silicon dioxide may be formed on a substrate 300 by using thermal oxidation, oxygen radicals, in-situ steam generation, or comparable methods. In other embodiments, gate dielectrics 305 and 308 may also comprise a high-K dielectric such as $HfO_2$, $ZrO_2$, $HfSiO_4$, etc. In yet other embodiments, other types of materials maybe used to generate a field effect in transistors.

Transistor gates 306 and 307, which may be n-type or p-type, may be formed on gate dielectrics 305 and 308. Transistor gates 306 and 307 may be n-type gates formed using polycrystalline Si doped with n-type impurities such as P or As. Transistor gates 306 and 307 may be p-type gates formed using polycrystalline Si doped with p-type impurities such as B. Transistor gates 306 and 307 may be doped in-situ during polycrystalline Si deposition or doped ex-situ using ion implantation. Photolithography steps comprising a resist deposition, exposure, and resist development may be employed to define transistor gates 306 and 307. In some embodiments, transistor gates 306 and 307 may comprise silicide layers, such as NiSi and CoSi. In other embodiments, transistor gates 306 and 307 may comprise other materials.

Transistor gates 306 and 307 may be n-type metal gates comprising metals such as Hf, Zr, Ti, Ta, and Al. Transistors gates 306 and 307 may be p-type metal gates comprising metals such as Ru, Pd, Pt, Co, Ni, Ti, Ta, Al, W, C, and Mo. In other embodiments, other types of metals may be used for transistor gates 306 and 307.

The source region 303 and drain regions 302 and 304 may be formed by ion implantation of n-type dopants for n-channel transistors or by ion implantation of p-type dopants for p-channel transistors. In other embodiments, the source region 303 and drain regions 302 and 304 may comprise other impurities such as Ge or C to impart compressive or tensile strain on the transistor channel. The source region 303 may form a common source between a plurality of transistors. Ion implantation steps used to form the source region 303 and drain regions 302 and 304 may "self-aligned," using transistor gates 306 and 307 and related sacrificial structures such as hard masks (not shown) and photoresist layers (not shown) as ion implantation masks. Ion implantation steps may also be "self-aligned" using spacers 309, 310, 311, and 312.

The formation of a first interlayer dielectric 316 may begin over a plurality of transistors by deposition of a preliminary first interlayer dielectric using processes such as CVD, plasma-enhanced vapor deposition (PECVD), HDPCVD, or SOG, which may be followed by a subsequent chemical mechanical planarization (CMP) process. The preliminary first interlayer dielectric may comprise $SiO_2$. The preliminary first interlayer dielectric may further comprise B and/or P. Different interlayer dielectric materials and processes may be used in other embodiments.

A source contact structure 314 and drain contact structures 310 and 312 may be formed by first forming contact holes through the preliminary first interlayer dielectric using photolithography followed by contact etch processes. Contact etch processes may be performed through the preliminary first interlayer dielectric using a reactive ion etch process using reactive ions or neutrals comprising F or Cl. Thus formed contact holes may be filled by a contact fill step where a conductive material such as heavily doped polycrystalline Si or a metal such as W is deposited into and over the first contact holes. The contact fill step may be performed using CVD, physical vapor deposition (PVD), or atomic layer deposition (ALD). The deposited Si or metal may further be subject to a CMP step to expose a substantially planar surface exposing the first interlayer dielectric 316, the source contact structure 314, and drain contract structures 310 and 312. Other structures, materials, and processes may be used to form a source contact structure 314 and drain contact structures 310 and 312.

First metal line structures 322, 324, and 326 comprising W, Al, Cu, or a similar metal may be formed over the surface exposing the first interlayer dielectric 316, the source contact structure 314, and drain contract structures 310 and 312. In an embodiment, the first metal line structures 322, 324, and 326 may be formed by a subtractive metal process. In a subtractive metal process, a preliminary first metal layer may be formed by a metal deposition process, followed by a photolithography step, followed by a metal etch step. The metal deposition process may be performed using CVD, PVD, ALD, or comparable methods. Metal etch processes may be performed using a reactive ion etch process using reactive ions or neutrals comprising F or Cl. A second interlayer dielectric 320 may subsequently formed by first depositing a preliminary second interlayer dielectric using processes such as CVD, PECVD, HDPCVD, SOG, or comparable method. A subsequent CMP may be performed to planarize the preliminary second interlayer dielectric. In other embodiments, the first metal line structures 322, 324, and 326 may be formed by a Cu damascene metallization process where the second preliminary interlayer dielectric deposition may be followed by a photolithography step, followed by an interlayer dielectric etch, followed by an electroplating step, followed by a metal CMP step. The resulting surface is a substantially co-planar surface exposing first metal line structures 322, 324, and 326 and the second interlayer dielectric 320. Other structures, materials, and methods may be used to form first metal line structures 322, 324, and 326.

First via structures 330 and 332 may be formed over the first metal line structures 322, 324, and 326 and the second interlayer dielectric 320 by first depositing a preliminary third interlayer dielectric using processes such as CVD, PECVD, HDPCVD, SOG, or other comparable processes. A subsequent CMP may follow. The preliminary third interlayer dielectric may comprise $SiO_2$. The preliminary third interlayer dielectric may further comprise C or F. Other materials and methods may be used to form the preliminary third interlayer dielectric.

First via holes may be formed through the preliminary third interlayer dielectric using photolithography followed by etch processes. Etch processes may be performed through the preliminary third interlayer dielectric using a reactive ion etch processes using reactive ions or neutrals comprising F or Cl. Thus formed first via holes may be filled by a first via fill step where a conductive material such as Al or W is deposited into and over the first via holes. In an embodiment, the first via fill step may be performed using CVD, physical vapor deposition (PVD), ALD, or other comparable processes. The deposited Al or W may further be subject to a CMP step to expose a substantially planar surface exposing a third interlayer dielectric 334 and first via structures 330 and 332. Other structures, materials, and methods may be used to form first via structures 330 and 332.

In other embodiments, first via structures 330 and 332 may be formed by a Cu damascene metallization process where a preliminary third interlayer dielectric deposition may be followed by a photolithography step, followed by a first via etch, followed by an electroplating step, followed by a metal CMP step. The resulting surface is a substantially co-planar surface exposing first via structures 330 and 332 and the third interlayer dielectric 334. Other structures, materials, and methods may be used to form first via structures 330 and 332.

Figure 7:
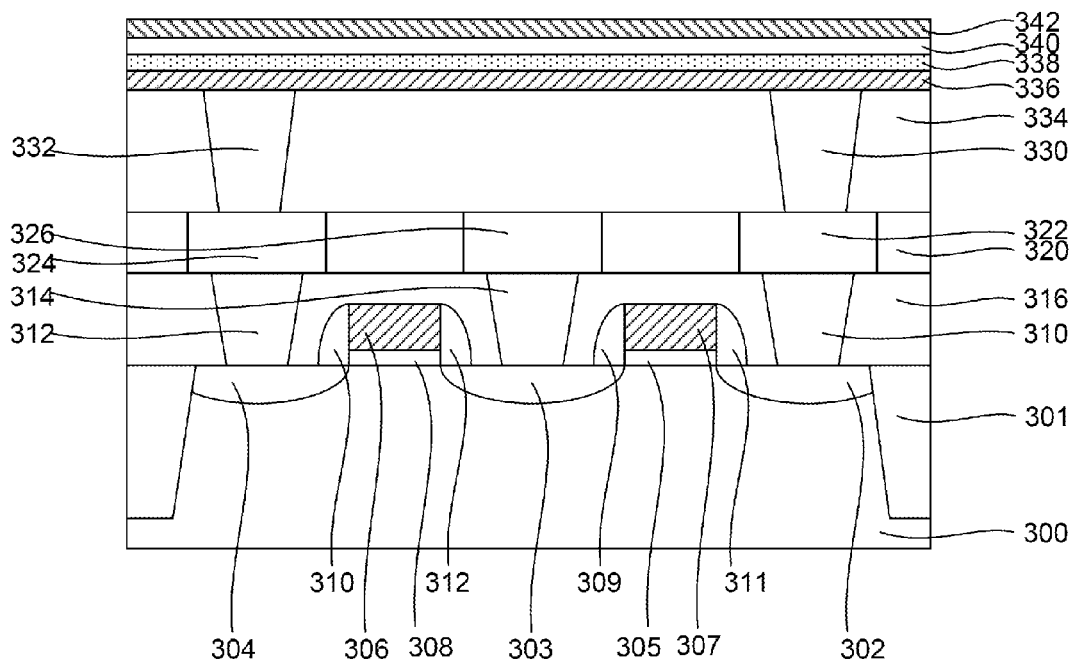
Figure 8:
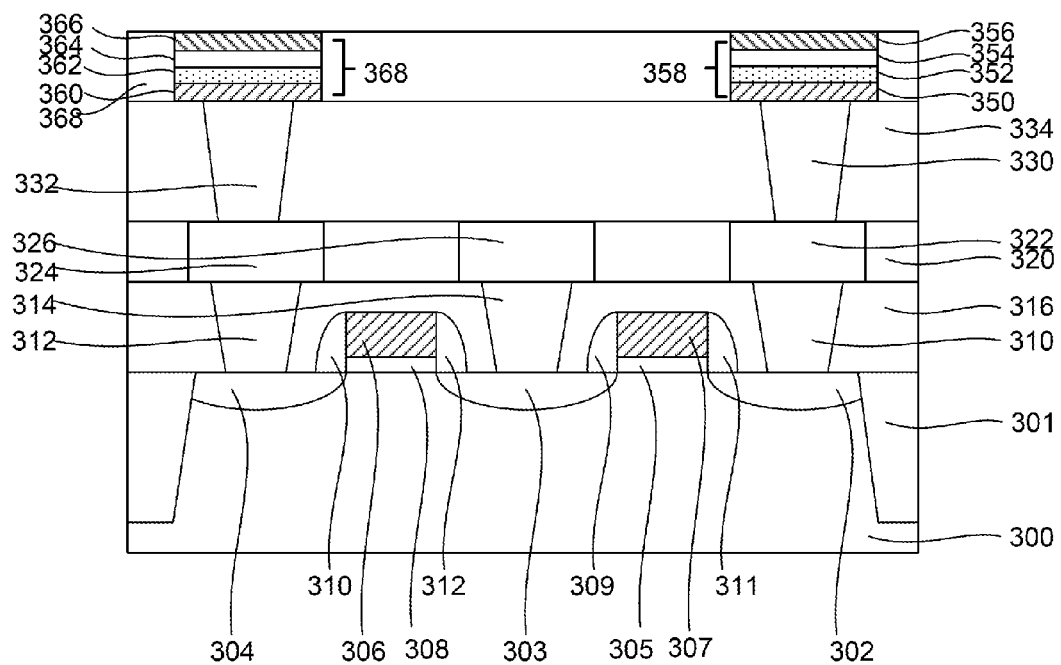

Referring to FIG. 7, a preliminary memory stack comprising a preliminary first electrode region 336, a preliminary first dielectric barrier region 338, a preliminary second dielectric barrier region 340, and a preliminary second electrode region 342 may be formed on the surface exposing first via structures 330 and 332 and the third interlayer dielectric 334. The preliminary first electrode region 336 may be formed using deposition processes such as CVD, PVD, ALD, electroplating, or other comparable processes. Other methods may be used to form the preliminary first electrode region 336.

In an embodiment, the preliminary first dielectric barrier region 338 may be formed on the preliminary first electrode region 336 using deposition processes such as CVD, PVD, ALD, or other comparable processes. The deposition condition may be controlled so that the composition of the first dielectric barrier region 338 is stoichiometric or sub-stoichiometric. For example, by performing deposition in a less oxidizing ambience, a sub-stoichiometric oxide may be formed. In another embodiment, the deposition may be performed using multiple metal sources so that the first dielectric barrier region 338 comprises a multiple metal oxide. For example, by performing an ALD process using a precursor containing Hf in addition to a precursor containing Si, a multiple metal oxide such as $HfSiO_4$ may be formed.

In another embodiment, the preliminary first dielectric barrier region 338 may be formed by first depositing a metal followed by oxidation, nitridization, or oxynitridization. For example, a metal such as Al or Mg may first be first deposited using CVD, PVD, ALD, electroplating, or other comparable processes, followed by oxidation, nitridization, or oxynitridization in oxidizing or nitridizing environment to form $Al_2O_3$, AlN, AlON, MgO, MgN, or MgON. In another embodiment, a combination of metals such as Hf and Si may be co-deposited using CVD, PVD, ALD, electroplating, or other comparable processes to form $HfSiO_4$. The oxidizing or nitridizing environment may be controlled so that the composition of the preliminary first dielectric barrier region 338 is sub-stoichiometric to varying degrees.

In another embodiment, the preliminary first dielectric barrier region 338 may be formed by first depositing a metal followed by deposition of an oxide or a nitride. A subsequent thermal anneal may be performed. For example, a metal such as Al or Mg may first be deposited using CVD, PVD, ALD, electroplating, or other comparable processes, followed by deposition of $Al_2O_3$ or MgO using processes such as CVD, PVD, ALD, or other comparable processes, to form a first dielectric sub-region (not shown) whose composition departs from a stoichiometric composition. In yet another embodiment, the resulting composition of the preliminary first dielectric barrier region 338 may be graded such that its stoichiometry varies continuously across its thickness.

In another embodiment, the preliminary first dielectric barrier region 338 may be formed by first depositing an oxide or a nitride followed by deposition of a metal. A subsequent thermal anneal may be performed. For example, an oxide such as metal such as $Al_2O_3$ or MgO may be first formed using processes such as CVD, PVD, ALD, or other comparable processes, followed by deposition of a metal such as Al or Mg using CVD, PVD, ALD, electroplating, or other comparable processes, to form a first dielectric sub-region (not shown) whose composition departs from a stoichiometric composition. In yet another embodiment, the resulting composition of the preliminary first dielectric barrier region 338 may be graded such that its stoichiometry varies continuously across its thickness.

In various other embodiments, other materials and methods may be used to form the preliminary first dielectric barrier region 338.

Referring again to FIG. 7, the preliminary second dielectric barrier region 340 may be formed on the preliminary first dielectric barrier region 338 using any of the steps described above to describe the formation of the preliminary first dielectric barrier region 338. In addition, a preliminary third dielectric barrier region (not shown) may be formed on the preliminary second dielectric barrier region 340 using any of the steps described above to describe the formation of the preliminary first dielectric barrier region 338. Other materials methods may be used to form the preliminary second dielectric barrier region 340 and/or the preliminary third dielectric barrier region.

Referring again to FIG. 7, the preliminary second electrode region 342 may be formed using deposition processes such as CVD, PVD, ALD, electroplating, or other comparable processes. Subsequently, a photolithography process (not shown) and a subsequent reactive ion etch process using reactive ions or neutrals comprising F or Cl may be performed to form a plurality of memory stacks 358 and 368 shown in FIG. 8. Memory stacks 358 and 368 comprise first electrode regions 350 and 360, first dielectric barrier regions 352 and 362, second dielectric barrier regions 354 and 364, and second electrode regions 356 and 366. A fourth interlayer dielectric 368 may subsequently be formed by depositing a dielectric over the memory stacks 358 and 368 using processes such as CVD, PECVD, HDPCVD, SOG, or other comparable processes. A subsequent CMP may follow to expose a substantially planar surface exposing memory stacks 358 and 368 and the fourth interlayer dielectric 368. The fourth interlayer dielectric may comprise $SiO_2$. The fourth interlayer dielectric 368 may further comprise C or F. Various other materials, structures, and methods may be used to form various structures described in this paragraph.

Figure 9:
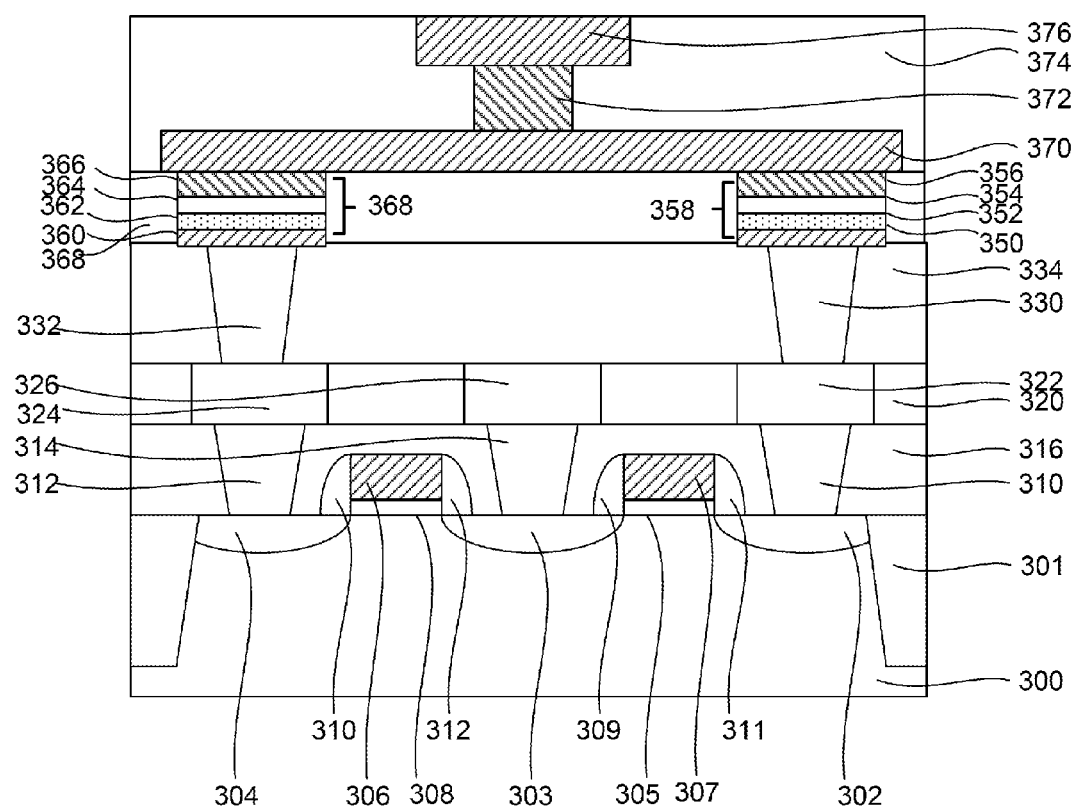

Referring to FIG. 9, a second metal line structure 370 and a third metal line structure 376 may be formed over memory stacks 358 and 368. The second metal line structure 370 and the third metal line structure 376 may be connected by a second via structure 372. The second metal line structure 370 and the third metal line structure 376 may comprise W, Al, Cu, or other comparable metals and may be formed by using substantially the same process steps used to form the first metal line structures 322, 324, and 326 described above. The second via structure 372 may comprise W, Al, Cu, or other comparable metals and may be formed by using substantially the same process steps used to form first via structures 330 and 332. Various other materials, structures, and methods may be used to form various structures described in this paragraph.

Figure 10:
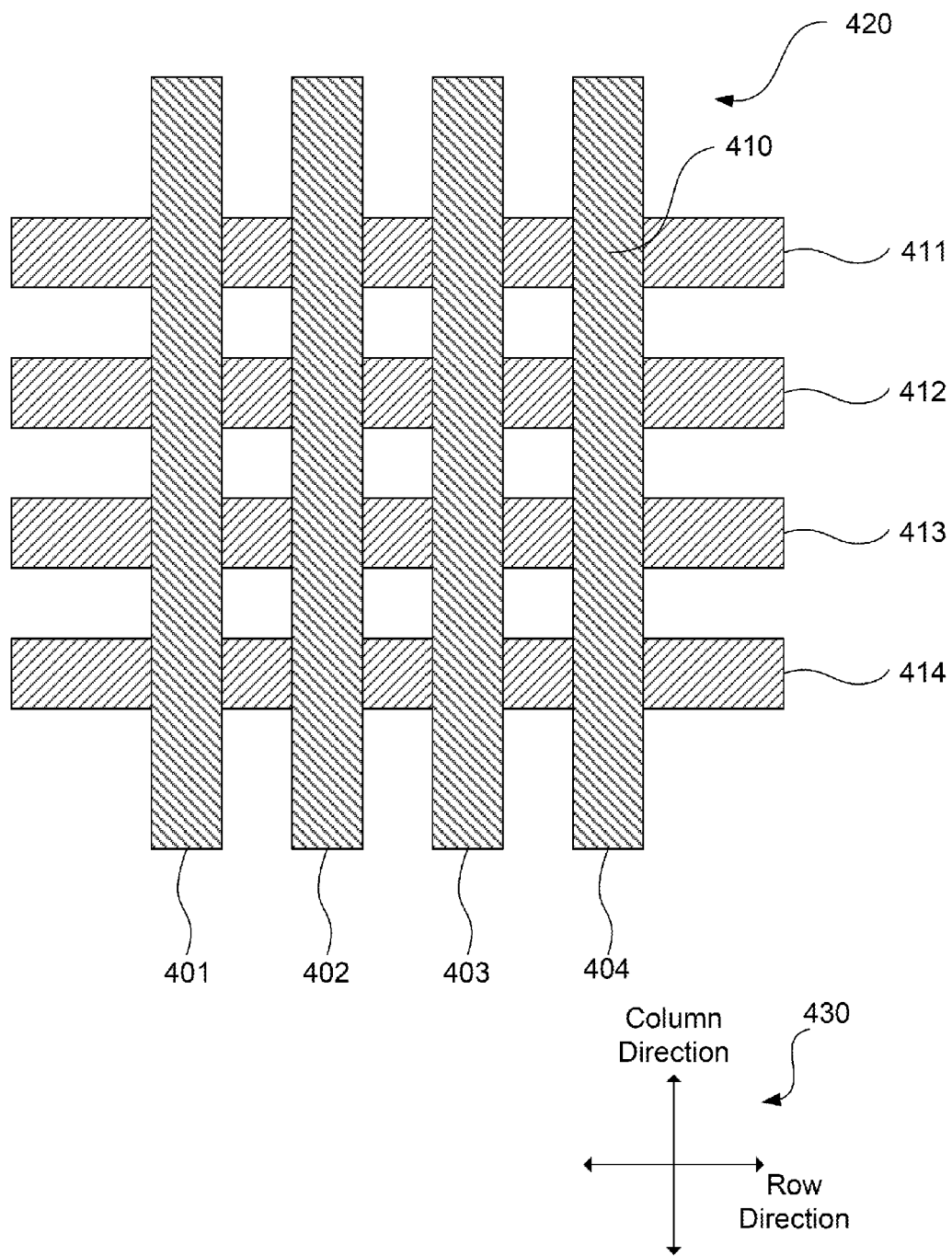
FIG. 10 is a top-down view illustrating an example embodiment of a memory array in a "cross-point" configuration.

FIG. 10 is a top-down view illustrating an example embodiment of a memory stack 410 in a "cross-point" configuration. The memory stack is between a top interconnect 404 and a bottom interconnect 411 (hidden here in the top-down view by the top interconnect 404). The top interconnect 404 may run along a direction such as a column direction illustrated by a legend 430. The bottom interconnect 411 may run along a direction such as a row direction illustrated by the legend 430. The column direction and the row direction may be substantially perpendicular. The top interconnect 404 and the bottom interconnect 411 may comprise W, Al, Cu, or a comparable metal and may be formed by using substantially the same process steps used to form the first metal line structures 322, 324, and 326 shown in FIG. 9. The memory stack 410 may be electrically coupled to the top interconnect 404 and the bottom interconnect 411. A memory array 420 comprising a plurality of memory stacks may be formed by placing a plurality of memory stacks between a plurality of top interconnects 401, 402, 403, and 404 and a plurality of bottom interconnects 411, 412, 413, and 414.

Figure 11:
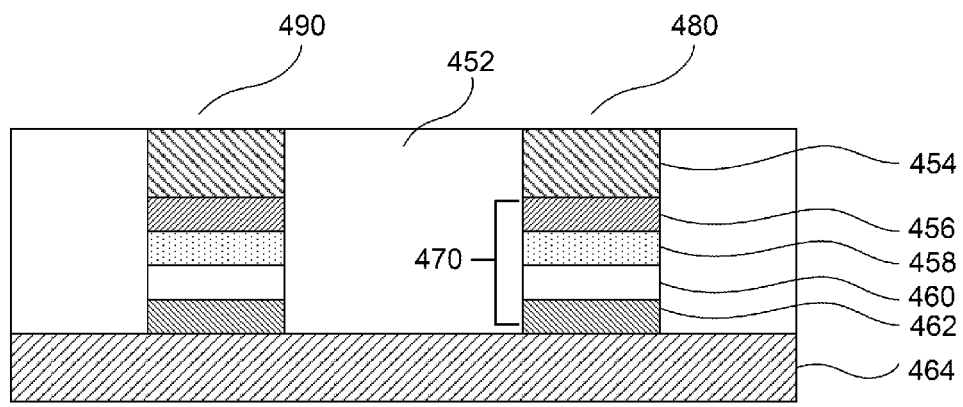
FIG. 11 is a cross-sectional view of a memory device comprising two dielectric barrier regions in "cross-point" configuration.

FIG. 11 is a cross-sectional view of a memory device 480 in "cross-point" configuration. The memory device comprises a memory stack 470. The memory stack 470 comprises a first electrode region 462, a first dielectric barrier region 460, a second dielectric barrier region 458, and a second electrode region 456. The memory stack 470 comprises substantially the same elements that comprise the example embodiment of the memory stack 140 in FIG. 2a. The memory device further comprises a top metal interconnect 454 and a bottom metal interconnect 464. The memory stack 470 may be electrically coupled to the top metal interconnect 454 and the bottom metal interconnect 464. The top metal interconnect 454 may run along a first horizontal direction. The bottom interconnect 464 may run along a second horizontal direction, wherein the second horizontal direction may be substantially perpendicular to the first horizontal direction. In an embodiment, there may be a plurality of memory devices 480 and 490. The memory device 480 and the memory device 490 may be separated by a space 452. The space 452 may comprise a dielectric. The space 452 may also comprise a void.

Figure 12:
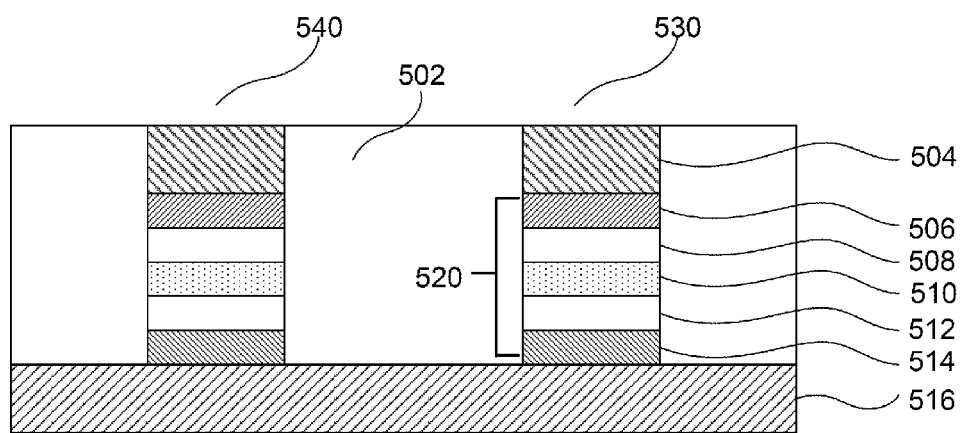
FIG. 12 is a cross-sectional view of a memory device comprising three dielectric barrier regions in "cross-point" configuration.

FIG. 12 is a cross-sectional view of a memory device 530 in a "cross-point" configuration. The memory device comprises a memory stack 520. The memory stack 520 comprises a first electrode region 514, a first dielectric barrier region 512, a second dielectric barrier region 510, a third dielectric barrier region 508, and a second electrode region 506. The memory stack 520 comprises substantially the same elements of the memory stack 158 in FIG. 3. The memory device further comprises a top metal interconnect 504 and a bottom metal interconnect 514. The memory stack 520 may be electrically coupled to the top interconnect 504 and the bottom metal interconnect 516. The top interconnect 504 may run along a first horizontal direction. The bottom interconnect 516 may run along a second horizontal direction, wherein the second horizontal direction is may be substantially perpendicular to the first horizontal direction. In an embodiment, there may be a plurality of memory devices 530 and 540. The memory device 530 and the memory device 540 may be separated by a space 502. The space 502 may comprise a dielectric. The space 502 may also comprise a void.

It is to be understood that while FIG. 11 and FIG. 12 show memory device embodiments in a "cross point" configuration without selection devices, other embodiments may have memory devices coupled selection devices. In an embodiment, memory devices may be coupled to transistors. In another embodiment, memory devices may be coupled to diodes. In yet another embodiment, memory devices may be coupled to chalcogenide-based switches.

In reference to FIG. 11, in an embodiment, memory devices 480 and 490 may be directly coupled to selection devices (not shown) through the first electrode region 462 or through the second electrode region 456. In other embodiments, memory devices may be coupled to selection devices (not shown) through the top metal interconnect 454 or the bottom metal interconnect 464. In reference to FIG. 12, in an embodiment, memory devices 530 and 540 may be directly coupled to selection devices (not shown) through the first electrode region 514 or through the second electrode region 506. In other embodiments, memory devices may be coupled to selection devices (not shown) through the top metal interconnect 504 or the bottom metal interconnect 516.

In reference to FIG. 11, it is to be understood that while embodiments described herein illustrate memory devices 480 and 490 in a vertical arrangement, other embodiments may have other arrangements. In an embodiment, memory devices 480 and 490 may be horizontally arranged. In an example embodiment, the memory device 480 may comprise the memory stack 470 arranged horizontally from left to right, with the first electrode region 462 on the left, the first dielectric barrier region 460 to the right of the first electrode region 462, the second dielectric barrier region 458 to the right of the first dielectric barrier region 460, and the second electrode region 456 to the right of the second dielectric barrier region 458.

Similarly, while embodiments described in FIG. 12 illustrate memory devices 530 and 540 in a vertical arrangement, other embodiments may have other arrangements. In an embodiment, memory devices 530 and 540 may be horizontally arranged. In an example embodiment, the memory device 530 may comprise the memory stack 520 arranged horizontally from left to right, with the first electrode region 514 on the left, the first dielectric barrier region 512 to the right of the first electrode region 514, the second dielectric barrier region 510 to the right of the first dielectric barrier region 512, the third dielectric barrier region 508 to the right of the second dielectric barrier region 510, and the second electrode region 506 to the right of the third dielectric barrier region 508.

I claim:

1. A memory device comprising:
a top metal interconnect;
a bottom metal interconnect running substantially perpendicular to the top metal interconnect;
a first dielectric barrier region between the top metal interconnect and the bottom metal interconnect, the first dielectric barrier region having a first thickness and having first dielectric barrier sidewalls;
a second dielectric barrier region between the top metal interconnect and the first dielectric barrier region, the second dielectric barrier region having a second thickness different from the first thickness and having second dielectric barrier sidewalls; and
an interlayer dielectric adjacent to first dielectric barrier sidewalls and second dielectric barrier sidewalls;
wherein first dielectric barrier sidewalls and second dielectric sidewalls are substantially aligned;
wherein the interlayer dielectric comprises Si and O;
wherein the top metal interconnect and the bottom metal interconnect each comprises a metal chosen from the group consisting of W, Al, or Cu.

2. The memory device in claim 1, further comprising a first electrode region between the bottom metal interconnect and the first dielectric barrier region, the first electrode region to electrically couple to the bottom metal interconnect.

3. The memory device in claim 2, further comprising a second electrode region between the second dielectric barrier region and the top metal interconnect, the second electrode region to electrically couple to the top metal interconnect.

4. The memory device in claim 3, wherein the second electrode region comprises Ti or Ta.

5. The memory device in claim 2, wherein the first electrode region comprises Ti or Ta.

6. The memory device in claim 1, wherein the first dielectric barrier region comprises an element chosen from the group consisting of Si, Al, Mg, La, Gd, Dy, Pd and Sc.

7. The memory device in claim 6, wherein the first dielectric barrier region comprises a first dielectric sub-region comprising a dielectric whose composition departs from stoichiometric composition by 30% to 50%.

8. The memory device in claim 6, wherein the first thickness is 0.5 nm to 2 nm.

9. The memory device in claim 1, wherein the first dielectric barrier region comprises Al or Mg.

10. The memory device in claim 1, wherein the second dielectric barrier region comprises an element chosen from the group consisting of W, Ni, Mo, Cu, Ti, Ta, Hf, Sr, Ba, Pr, Ca and Mn.

11. The memory device in claim 10, wherein the second dielectric barrier region comprises a second dielectric sub-region comprising a dielectric whose composition departs from stoichiometric composition by 30% to 50%.

12. The memory device in claim 10, wherein the second dielectric barrier region has a graded composition.

13. The memory device in claim 10 wherein the second thickness is 5 nm to 10 nm.

14. The memory device in claim 1, wherein the second dielectric barrier region comprises Hf or Ti.

15. A memory device comprising:
a top metal interconnect;
a bottom metal interconnect;
a first dielectric barrier region between the top metal interconnect and the bottom metal interconnect, the first dielectric barrier region having a first thickness and a first dielectric constant and first dielectric barrier sidewalls;
a second dielectric barrier region between the top metal interconnect and the first dielectric barrier region, the second dielectric barrier region having a second thickness different from the first thickness and a second dielectric constant different from the first dielectric constant and second dielectric barrier sidewalls;
a third dielectric barrier region between the top metal interconnect and the second barrier region, the third dielectric barrier region having a third thickness different from the second thickness and a third dielectric constant different from the second dielectric constant and third dielectric barrier sidewalls;
an interlayer dielectric adjacent to first dielectric barrier sidewalls, second dielectric barrier sidewalls, and third dielectric barrier sidewalls; wherein first dielectric barrier sidewalls, second dielectric sidewalls, and third dielectric sidewalls are substantially aligned; and
wherein the interlayer dielectric comprises Si and O.

16. The memory device in claim 15 wherein:
the top metal interconnect has a first major axis; and
the bottom metal interconnect has a second major axis, the second major axis running substantially perpendicular to the first major axis.

17. The memory device in claim 16, wherein the top metal interconnect and the bottom metal interconnect each comprises a metal chosen from the group consisting of W, Al, or Cu.

18. The memory device in claim 16, further comprising a first electrode region between the bottom metal interconnect and the first dielectric barrier region, the first electrode region to electrically couple to the bottom metal interconnect.

19. The memory device in claim 16, further comprising a second electrode region between the third dielectric barrier region and the top metal interconnect, the second electrode region to electrically couple to the top metal interconnect.

20. The memory device in claim 16, wherein the first thickness is 0.5 nm to 2 nm.

21. The memory device in claim 16 wherein the second thickness is 5 nm to 10 nm.

22. The memory device in claim 16, wherein the third thickness is substantially equal to the first thickness.

23. The memory device in claim 15, wherein the first dielectric barrier region comprises an element chosen from the group consisting of Si, Al, Mg, La, Gd, Dy, Pd and Sc.

24. The memory device in claim 15, wherein the first dielectric barrier region comprises Al or Mg.

25. The memory device in claim 15, wherein the second dielectric barrier region comprises an element chosen from the group consisting of W, Ni, Mo, Cu, Ti, Ta, Hf, Sr, Ba, Pr, Ca and Mn.

26. The memory device in claim 25, wherein the second dielectric barrier region has a graded composition.

27. The memory device in claim 15, wherein the second dielectric barrier region comprises Hf or Ti.

28. A memory device comprising:
a top metal interconnect;
a bottom metal interconnect running substantially perpendicular to the top metal interconnect;
a first dielectric barrier region between the top metal interconnect and the bottom metal interconnect, the first dielectric barrier region having a first thickness and having first dielectric barrier sidewalls;
a second dielectric barrier region between the top metal interconnect and the first dielectric barrier region, the second dielectric barrier region having a second thickness different from the first thickness and having second dielectric barrier sidewalls; and
an interlayer dielectric adjacent to first dielectric barrier sidewalls and second dielectric barrier sidewalls;
wherein first dielectric barrier sidewalls and second dielectric sidewalls are substantially aligned;
wherein the interlayer dielectric comprises Si and O;
wherein the first dielectric barrier region comprises at least one member selected from the group consisting of $SiO_2$, $HfSiO_4$, Al, Mg, La, Gd, Dy, Pd and Sc.

29. The memory device in claim 28, further comprising a first electrode region between the bottom metal interconnect and the first dielectric barrier region, the first electrode region to electrically couple to the bottom metal interconnect.

30. The memory device in claim 29, wherein the first electrode region comprises an element chosen from the group consisting of Ti or Ta.

31. The memory device in claim 28, further comprising a second electrode region between the second dielectric barrier region and the top metal interconnect, the second electrode region to electrically couple to the top metal interconnect.

32. The memory device in claim 31, wherein the second electrode region comprises an element chosen from the group consisting of Ti or Ta.

33. The memory device in claim 28, wherein the second dielectric barrier region comprises an element chosen from the group consisting of W, Ni, Mo, Cu, Ti, Ta, Hf, Sr, Ba, Pr, Ca and Mn.

34. The memory device in claim 28, wherein the first dielectric barrier region comprises a first dielectric sub-region comprising a dielectric whose composition departs from stoichiometric composition by 30% to 50%.

35. The memory device in claim 28, wherein the second dielectric barrier region has a graded composition.

36. The memory device in claim 28, wherein the second thickness is between 5 nm to 10 nm.

* * * * *